(12) United States Patent
Yoshida et al.

(10) Patent No.: US 7,586,707 B2
(45) Date of Patent: Sep. 8, 2009

(54) MAGNETIC DISK DRIVE WITH INCREASED STORAGE CAPACITY

(75) Inventors: Hitoshi Yoshida, Kanagawa (JP);
Noriyuki Sumiya, Kanagawa (JP);
Nobuhito Kitamura, Kanagawa (JP)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 203 days.

(21) Appl. No.: 11/544,883

(22) Filed: Oct. 5, 2006

(65) Prior Publication Data

US 2007/0081267 A1    Apr. 12, 2007

(30) Foreign Application Priority Data

Oct. 6, 2005    (JP)    ............................. 2005-293559

(51) Int. Cl.
*G11B 5/09*    (2006.01)
(52) U.S. Cl. .............................. 360/51; 360/48; 360/53; 360/77.02
(58) Field of Classification Search .................. None
See application file for complete search history.

(56) References Cited

U.S. PATENT DOCUMENTS

| | | | | | |
|---|---|---|---|---|---|
| 4,777,542 | A | * | 10/1988 | Ozaki | 360/48 |
| 4,791,622 | A | * | 12/1988 | Clay et al. | 369/59.26 |
| 5,036,408 | A | * | 7/1991 | Leis et al. | 360/48 |
| 5,278,703 | A | * | 1/1994 | Rub et al. | 360/51 |
| 5,475,540 | A | * | 12/1995 | Gold | 360/48 |
| 5,631,783 | A | * | 5/1997 | Park | 360/51 |
| 5,852,524 | A | * | 12/1998 | Glover et al. | 360/51 |
| 6,009,549 | A | * | 12/1999 | Bliss et al. | 714/769 |
| 6,583,943 | B2 | * | 6/2003 | Malone, Sr. | 360/48 |
| 6,873,483 | B2 | * | 3/2005 | Hetzler et al. | 360/51 |
| 7,003,626 | B1 | * | 2/2006 | Chheda et al. | 711/112 |
| 7,006,316 | B1 | * | 2/2006 | Sargenti et al. | 361/51 |

(Continued)

FOREIGN PATENT DOCUMENTS

JP    08-138329    5/1996

(Continued)

*Primary Examiner*—William J Klimowicz
*Assistant Examiner*—Dismery E Mercedes
(74) *Attorney, Agent, or Firm*—Townsend and Townsend and Crew LLP; Patrick Duncan

(57) ABSTRACT

Embodiments of the invention provide a magnetic disk drive capable of reducing an area used for a preamble of each data sector to increase the storage capacity. The magnetic disk drive adopts a data-surface servo system. In one embodiment, main preambles are written on a magnetic disk at a frequency of a data clock. Each of data sectors is written with a write clock that is synchronized with a signal obtained by reading the main preamble. The data sectors include sub preambles respectively. When the data sector which has been written in this manner is read, a read clock is synchronized by use of a signal obtained by reading the main preamble, and a signal obtained by reading the sub preamble included in a data sector to be read. The bit length of the sub preamble is shorter than that of the conventional preamble that is used to independently achieve the synchronization. Accordingly, an area whose length is calculated by summing the bit length of the main preamble and that of the sub preamble becomes smaller than an area whose length is calculated by summing the bit length of the conventional preambles.

19 Claims, 4 Drawing Sheets

U.S. PATENT DOCUMENTS

| | | | |
|---|---|---|---|
| 7,035,029 B2* | 4/2006 | Sawada et al. | 360/51 |
| 7,046,465 B1* | 5/2006 | Kupferman | 360/48 |
| 7,212,363 B2* | 5/2007 | Nagasaka | 360/48 |
| 7,280,295 B2* | 10/2007 | Dati et al. | 360/51 |
| 2004/0179287 A1* | 9/2004 | Sawada et al. | 360/51 |
| 2004/0212912 A1 | 10/2004 | Okamoto et al. | |
| 2005/0002295 A1* | 1/2005 | Tsunoda | 369/47.19 |
| 2005/0052769 A1* | 3/2005 | Yasuna et al. | 360/48 |
| 2005/0068652 A1 | 3/2005 | Tomimoto | |

FOREIGN PATENT DOCUMENTS

| | | |
|---|---|---|
| JP | 2002-124037 | 4/2002 |
| JP | 2004-253042 | 9/2004 |

\* cited by examiner (A)

(B)

MAGNETIC DISK DRIVE WITH INCREASED STORAGE CAPACITY

CROSS-REFERENCES TO RELATED APPLICATIONS

This application claims priority from Japanese Patent Application No. JP2005-293559, filed Oct. 6, 2005, the entire disclosure of which is incorporated herein by reference.

BACKGROUND OF THE INVENTION

The present invention relates to a format structure of data sectors formed on a magnetic disk, and more particularly to a technology for reducing an area used for a preamble of each data sector to increase the storage capacity of a magnetic disk drive.

Some magnetic disk drives adopt a data-surface servo system, which is also called a sector servo system, in which servo control is performed by writing servo data to a recording surface to which user data is written. In a format structure of a magnetic disk, which is adopted in the data-surface servo system, each data area is formed between servo sectors that are discretely located in each data track in the circumferential direction. A plurality of data sectors are written to each data area. The magnetic disk drive is usually configured as a direct access storage device that is capable of writing and reading data on a data sector basis. The data sectors are not written with a write clock that is synchronized with the rotational speed of the magnetic disk. Therefore, in order to realize a direct access storage device, every data sector includes a preamble used for synchronization with a read clock.

At the time of writing, a data sector which includes a preamble and user data is written at a specified position with a write clock having a specified frequency. At the time of reading, for each data sector to be read, user data is read with a read clock being synchronized with a signal obtained by reading a preamble of the data sector in question. In order to synchronize the read clock with a clock obtained by reading the preamble, a phase-locked loop circuit is required to read a preamble having a specified pattern length.

The preamble includes a redundant part so as to cope with the jitter occurring in, for example, the rotational speed of the magnetic disk at the time of reading, and the timing of a read gate. Because the preamble is written to a data area, the preamble narrows a write area of user data. Therefore, it is desirable that the pattern length of the preamble be made as short as possible. Patent document 1 (Japanese Patent Laid-open No. 2004-280898) discloses an information writing and reading device in which a preamble is shortened to extend a write area. As shown in FIGS. 1(b) and 1(c) in patent document 1, a preamble of each data sector is divided into first, second, and third preambles.

Patent document 2 (Japanese Patent Laid-open No. 2005-100529) discloses a technology for reducing a synchronization area of a split sector. As shown in FIG. 3 in patent document 2, a synchronization area of a first split sector is divided into a phase synchronization area and a phase frequency synchronization area. However, a synchronization area of a second split sector forms only a phase synchronization area. A synchronizing frequency at the time of reading the first split sector is stored in a synchronizing frequency storage unit shown in FIG. 1 in patent document 2. When the second split sector is read, this stored synchronizing frequency and a pattern of a synchronization area are used.

BRIEF SUMMARY OF THE INVENTION

With the objective of generating a clock that is synchronized with a signal obtained by reading a preamble, a synchronous circuit which is an element of a read/write channel is required to read a preamble having a specified bit length. Although some amount of jitter is allowed in the rotational speed of a magnetic disk and a data clock, the influence of the rotation jitter is in particular large as a factor that destabilizes synchronization. As far as the conventional magnetic disk drives are concerned, at the time of writing, a data sector is written with a write clock having a fixed frequency. At the time of reading, a read clock is synchronized with a read signal of a preamble written at the top of each data sector. As a result, even if the rotation jitter and the clock jitter occur, it is possible to properly make a read on a data sector basis. Therefore, a preamble whose bit length is enough to completely synchronize a read clock with a read signal of written data is written to each data sector.

However, in a synchronous circuit which is formed of a phase-locked loop, after the input of a read signal of a preamble, which is a reference signal of the synchronization, is temporarily interrupted, the read signal may be inputted again. In this case, it is possible to complete synchronous operation in a shorter period of time, as compared with a case where the synchronous operation is performed from the beginning, unless a frequency of the read signal remarkably changes. This means that it is not necessary to form, at the top of each data sector, a preamble whose bit length is enough to achieve complete synchronization. In addition, if the preceding data sector of a data sector to be read can be used for the synchronization of a read clock at the time of reading, it is possible to further shorten the bit length of the preamble.

Accordingly, a feature of the present invention is to provide a magnetic disk drive capable of reducing a write area used for a preamble of each data sector to increase the storage capacity. Another feature of the present invention is to provide a data write/read method for reducing a write area used for a preamble to increase the storage capacity in a magnetic disk drive.

One of the key principles of the present invention is the introduction of a main, preamble or a common preamble by reducing a write area used for a preamble constituting each data sector. The main preamble and the common preamble are each written beforehand at a data-clock frequency that is specified on a zone basis. It is so configured that both of them are not rewritten during write operation of user data. Although both of the main preamble and the common preamble are used to achieve the synchronization of a read clock and a write clock of a read/write channel, the main preamble works in cooperation with the sub preamble constituting each data sector, whereas the common preamble works independently.

A data sector described in this specification includes all data elements constituting the data sector. In one mode, a data sector is always written with a write clock that is synchronized with a read signal of a main preamble. Therefore, the linear recording density of a written data sector substantially coincides with the linear recording density of a main preamble used for the synchronization although there is an extremely slight difference caused by the rotation jitter of a magnetic disk, and dual head offset, both of which occur from the time at which the main preamble is read until the write time of the written data sector. When the data sector which has been written in this manner is read, a read clock is synchronized by use of a signal obtained by reading the main preamble, and a signal obtained by reading the sub preamble of the data sector to be read. The synchronization of the read clock means not only complete synchronization of the read clock, but also synchronizing a read signal of a sub preamble with a phase and a frequency to a degree that makes it possible to read data without causing a problem.

Because the main preamble and the sub preamble are written with substantially the same linear recording density, it is possible to eliminate the rotation jitter and the clock jitter to read user data by performing synchronous operation of a read clock with a signal obtained by reading the main preamble, and by further performing synchronous operation of a signal obtained by reading the sub preamble in the data sector to be read. Here, the synchronization of the read clock by use of the main preamble includes not only complete synchronization that is sufficient for reading subsequent data without causing a problem, but also incomplete synchronization that is inferior to the complete synchronization. If the read clock is incompletely synchronized with the read signal of the main preamble, the read clock is further synchronized with the read signal of the sub preamble to a degree that makes it possible to read data. If such a configuration is used, the main preamble can be used to synchronize the read clock in common at the time of reading each data sector. This avoids the necessity for making the bit length of the sub preamble long enough to independently achieve the synchronization.

If an interval between a main preamble and a data sector corresponding thereto in the circumferential direction becomes long, a read clock cannot be properly synchronized due to the rotation jitter of a magnetic disk, which occurs from the time at which the main preamble is read until the time at which the sub preamble is read. Accordingly, it is desirable that a main preamble and a plurality of data sectors written in synchronization with the main preamble be located in a data area formed between the same servo sectors. If sub preambles in all data sectors are configured to have the same bit length, it is possible to make the total bit length of each data sector equivalent to that of the other data sectors. This conveniently prevents a circuit for detecting a position of a data sector from becoming complicated.

As is the case with the preamble adopted in each data sector of the conventional magnetic disk drive, by setting the bit length of a main preamble at a value that is sufficient for reading user data, and by making the bit length of the sub preamble shorter than that of the main preamble, it is possible to reduce a write area whose length is the sum of the main preamble and the sub preamble. Because the main preamble and the sub preamble are used for synchronization as one unit, it is possible to make the bit length of the sub preamble shorter than that of the main preamble. By setting a ratio of the bit length of a sub preamble to that of a main preamble at a value ranging from about 10% to 40%, it is possible to balance the write efficiency with a synchronization function.

If a main preamble is located at a position adjacent to its preceding servo sector, it is convenient to detect a position of a data sector subsequent to the main preamble, and also to control a read/write channel. However, it is not necessary to locate the main preamble at the position adjacent to its preceding servo sector. At the time of writing or reading, by achieving the synchronization of a write clock and a read clock by use of a signal obtained by reading the main preamble and a signal obtained by reading the preceding data sector of a data sector to be written or read, the influence of the clock jitter and the rotation jitter can be reduced, and consequently the performance of read operation can be further improved. According to the present invention, by strictly setting the tolerance of the rotation jitter, it is also possible to omit a sub preamble, and thereby to configure such a format of a magnetic disk that a common preamble and a preamble are eliminated from each data sector.

According to the present invention, it becomes possible to provide a magnetic disk drive capable of reducing a write area used for a preamble of each data sector to increase the storage capacity. Moreover, according to the present invention, it becomes possible to provide a write/read method for writing/reading data by which a write area used for a preamble is reduced to increase the storage capacity in the magnetic disk drive.

DETAILED DESCRIPTION OF THE INVENTION

Figure 1:
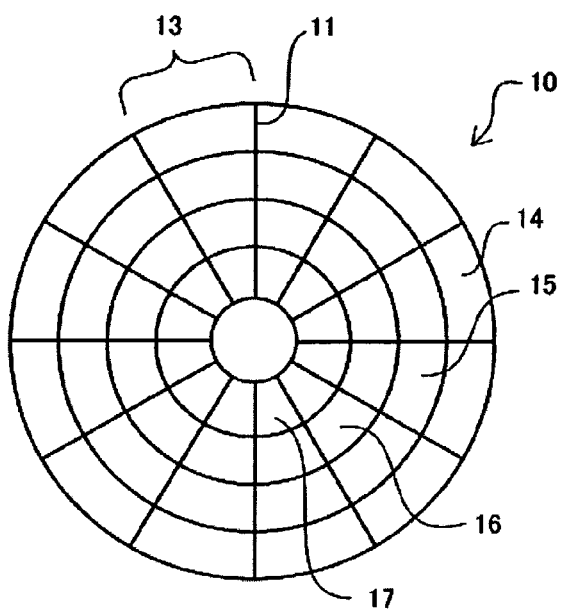
FIG. 1 includes diagrams each illustrating a format of a magnetic disk using a data-surface servo system according to this embodiment.
Figure 1:
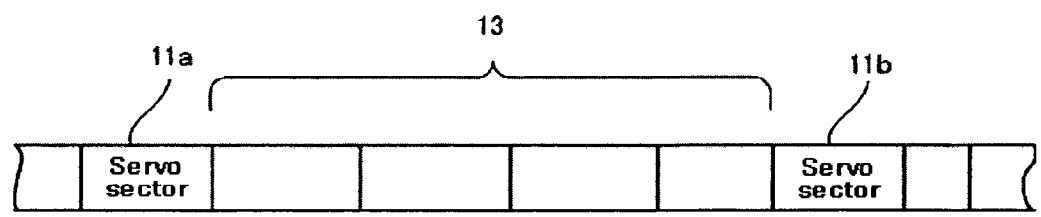

FIGS. 1(A) and 1(B) are diagrams each illustrating a format structure of a magnetic disk 10 adopted in a magnetic disk drive according to an embodiment of the present invention. The magnetic disk 10 has a format structure that is applied to magnetic disk drives adopting the data-surface servo system. As shown in FIG. 1(A), a plurality of servo sectors 11 which radially extend in the radial direction are written to the magnetic disk 10. Although the number of servo sectors 11 is simplified in the figure, the number of servo sectors 11 to be actually located is determined on the basis of the density (TPI) in a track direction. As shown in FIG. 1(B), a data area 13 is formed between servo sectors 11a, 11b; and a plurality of data sectors are defined in the data area 13. The other servo sectors and the other data areas are also formed substantially in the same manner. A configuration of the data area 13 will be described in detail later.

As a magnetic head nears data tracks on the outer circumferential side thereof, the data tracks which pass the magnetic head are more increased in speed. In order to equalize the number of recorded bits per unit length on the outer circumferential side to that on the inner circumferential side as much as possible so that the storage capacity is increased, the magnetic disk 10 is partitioned into four zones 14 through 17 in the radial direction. In each zone, data sectors are written to the data area 13 with a write clock having the same frequency. However, in a zone that is closer to the outer circumferential side, a frequency of the write clock is made higher so that the number of data sectors increases. This method is called a zone-bit recording method.

Servo data is written to each servo sector. Positions of a plurality of data tracks that are concentrically formed, and positions of data sectors formed in each data track, are defined by a read signal of the servo data. Each servo data is written from the inner circumferential side towards the outer circumferential side at a constant frequency irrespective of the difference of the zones 14 through 17. A frequency of a servo clock for writing servo data differs from that of a data clock for writing data sectors. The frequency of the servo clock is about one-fifth of the frequency for the zone 14 that is the highest data-clock frequency.

Configuration of Magnetic Disk Drive

Figure 2:
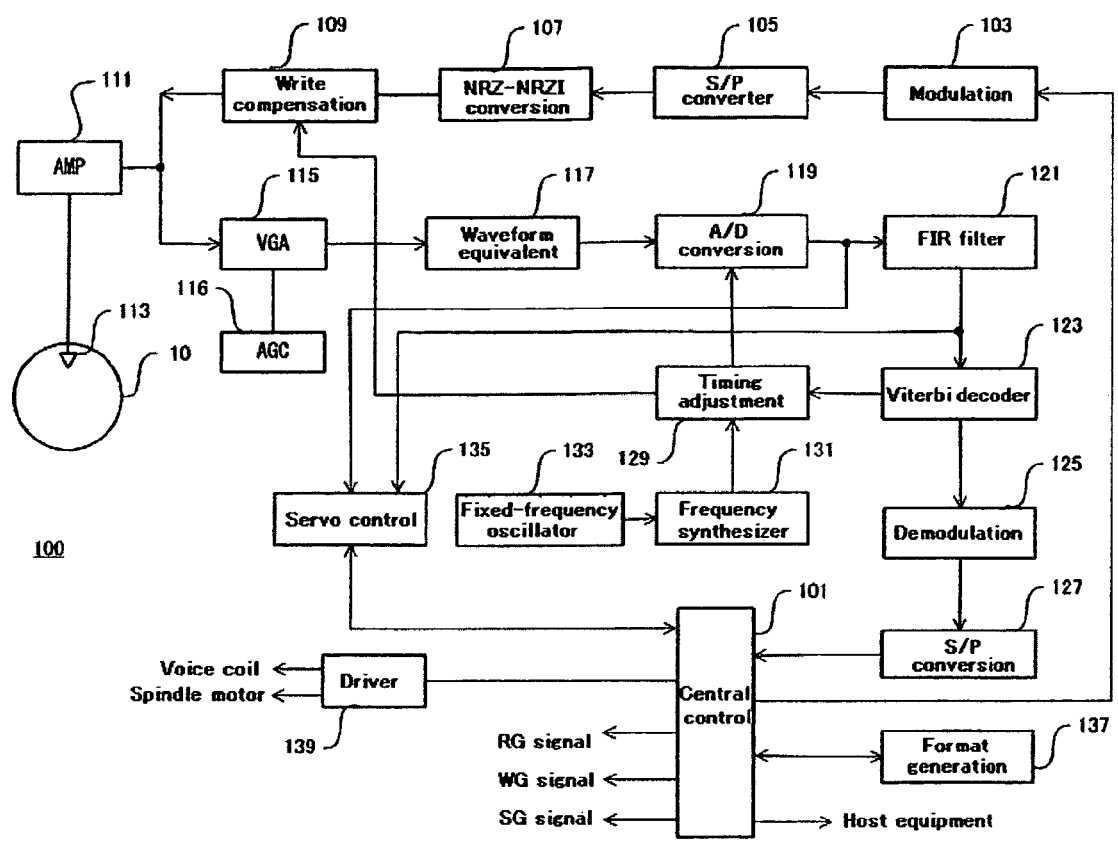
FIG. 2 is a schematic block diagram illustrating a magnetic disk drive according to this embodiment.

A configuration of the magnetic disk drive 100 according to the embodiment of the present invention will be schematically described with reference to FIG. 2. In the description in FIG. 2, known elements of the magnetic disk drive are simplified or omitted. A central control circuit 101 includes a processor and a memory. The central control circuit 101 totally controls the magnetic disk drive 100 to perform data communications with host equipment, and to perform write and read operation of user data to the magnetic disk 10. The central control circuit 101 generates a servo gate pulse (SG pulse), a read gate pulse (RG pulse), and a write gate pulse (WG pulse). The central control circuit 101 transmits the pulses to a read/write channel, a servo control circuit 135, and the like. The SG pulse, the RG pulse, and the WG pulse are signals used to determine the timing of read or write operation for a servo sector at the time of reading, for a data sector at the time of reading, and for a data sector at the time of writing, respectively.

A modulation circuit 103 converts user data transmitted from the central control circuit 101 into an RLL (Run Length Limited) code that is suitable for writing to a recording medium. A parallel/serial converter 105 serial-parallel converts the RLL code transmitted from the modulation circuit 103. An NRZ-NRZI conversion circuit 107 converts a signal of the NRZ method, which is based on a user data format, into a signal of the NRZI (Non-Return to Zero Inverse) method that is suitable for writing to a magnetic disk. A write compensation circuit 109 is a circuit for shifting the timing of feeding a write current so as to compensate NLTS (Non Linear Transition Shift) that is equivalent to the deviation time of a magnetization reversal point. The write compensation circuit 109 transmits, to a write driver of a head amplifier 111, a write current used to write user data in the timing of a write clock received from a timing adjustment circuit 129.

A magnetic head 113 includes a write head and a read head. The head amplifier 111 feeds a write current to the write head so that a data sector is written. The head amplifier 111 further includes a read amplifier for amplifying a signal read by the read head. AN RG pulse and a WG pulse received from the central control circuit 101 are used to switch to the read amplifier and the write driver, respectively, and to switch the magnetic head 113 to another in a case where a magnetic disk has a plurality of recording surfaces. Hereinafter, the modulation circuit 103, the parallel/serial converter 105, the NRZ-NRZI conversion circuit 107, the write compensation circuit 109, and the head amplifier 111 are called a write channel.

The read head is used to read a servo sector and a data sector. A variable gain amplifier 115 and an automatic gain controller 116 keep constant the amplitude of a read signal of user data, and that of servo data, which have been received from the head amplifier 111. A waveform equivalent circuit 117 includes a low-pass filter capable of programmably changing a high-band gain, and thereby the waveform equivalent circuit 117 can eliminate noises included in a read signal to achieve equivalency of a waveform. The equivalence means signal processing of adjusting to a PR (Partial Response) class based on a waveform of a read signal. An A/D converter 119 includes a differentiation circuit, a filter, and a comparator. The A/D converter 119 generates a read pulse signal from an analog read signal. The timing in which the read pulse signal is generated is acquired by a read clock supplied from the timing adjustment circuit 129.

A FIR (Finite Impulse Response) filter 121 is a digital filter that includes a plurality of serially connected delay operators. The FIR filter sets a tap value to generate a signal that is easy to decode. A Viterbi decoder 123 uses a PRML (Partial Response Maximum Likelihood) circuit to handle a signal handled by the FIR filter 121, and then outputs the signal as an RLL code. A demodulator 125 converts the RLL code into data of a NRZ code string in a user data format. A serial/parallel converter 127 converts the NRZ code string into parallel data, and then transmits the parallel data to the central control circuit 101.

Hereinafter, the head amplifier 111, the variable gain amplifier 115, the automatic gain controller 116, the waveform equivalent circuit 117, the A/D converter 119, the FIR filter 121, the Viterbi decoder 123, the demodulator 125, and the serial/parallel converter 127 are called a read channel. In addition, a channel in which the write channel and the read channel are combined is defined as a read/write channel. The readlwrite channel operates in response to the RG pulse and the WG pulse that are generated by the central control circuit 101.

The timing adjustment circuit 129 includes a phase locked loop (PLL) oscillator circuit. The timing adjustment circuit 129 synchronizes an output signal of the Viterbi decoder 123 with a data clock supplied from a frequency synthesizer 131 so that a read clock and a write clock are generated. The timing adjustment circuit 129 supplies the read clock to the A/D converter 119, and thereby controls the timing in which the A/D converter 119 digitizes an analog signal generated when user data written to the data area 13 is read out. The timing adjustment circuit 129 further supplies the write clock to the write compensation circuit 109 so as to control the timing in which the write compensation circuit 109 generates a write current of user data.

Figure 3:
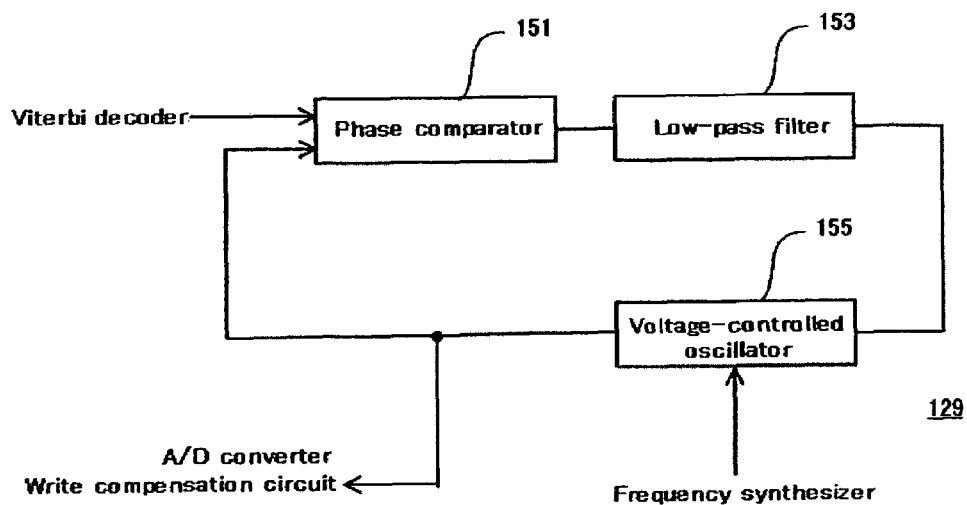
FIG. 3 is a diagram illustrating a configuration of a timing adjustment circuit.

As shown in FIG. 3, the timing adjustment circuit 129 is configured to include a phase comparator 151, a low-pass filter 153, and a voltage-controlled oscillator (VCO) 155. The timing adjustment circuit 129 is a circuit for acquiring an output signal of the VCO 155 that is synchronized with a reference signal inputted from the Viterbi decoder 123. The phase comparator 151 compares a phase of a reference signal inputted from the Viterbi decoder 123 with a phase of an output signal of the VCO 155 to determine the phase difference, and then outputs the phase difference as a pulsed difference signal.

The low-pass filter 153 cuts a high frequency component of an input signal, and outputs a control voltage for controlling the VCO 155. In the VCO 155, a frequency of a data clock supplied from the frequency synthesizer 131 is used as a free-running frequency. The VCO 155 is a circuit that adjusts a frequency of an output signal by the feedback control using a control voltage from the low-pass filter 153, the control voltage being applied to the control terminal. If a phase of an output signal is advanced relative to a reference signal, the VCO 155 decreases an oscillation frequency to delay the phase. On the other hand, if the phase of the output signal is delayed, the VCO 155 increases the oscillation frequency to advance the phase. Thus, the VCO 155 operates so that the phase difference between the output signal and the reference signal becomes equal to zero. The timing adjustment circuit 129 adjusts the frequency so that the phase is synchronized. However, when the phase of the output signal of the VCO 155 is synchronized with a phase of the reference signal, a frequency is also synchronized as a result.

The timing adjustment circuit 129 transmits the output of the synchronized data clock to the read/write channel and the central control circuit 101. Because the timing adjustment circuit 129 synchronizes the output signal of the VCO 155 with the reference signal by the feedback control, the synchronization requires the specified length of time during which the output signal is compared with the reference signal. The frequency synthesizer 131 includes a phase comparator, a low-pass filter, a VCO, and a divider. The frequency synthesizer 131 outputs each data clock having a frequency corresponding to each of the zones 14 through 17 according to a control signal received from the central control circuit 101. A fixed-frequency oscillator 133 includes a crystal oscillator, and supplies a single frequency to the frequency synthesizer 131. The timing adjustment circuit 129, the frequency synthesizer 131, and the fixed-frequency oscillator 133 are elements of the read channel and those of the write channel.

The servo control circuit 135 operates in response to an SG pulse supplied from the central control circuit 101. The servo control circuit 135 transmits, to the central control circuit 101, a digital signal generated when a burst pattern of servo data received from the FIR filter 121 is read out. In addition, the servo control circuit 135 supplies a timing signal to the central control circuit 101 so that an address mark of the servo data received from the FIR filter 121 is read out to generate an SG pulse, an RG pulse, and a WG pulse. The driver circuit 139 includes a driver for generating an electric current to be supplied to a spindle motor and a voice coil. The driver circuit 139 supplies, to the spindle motor and the voice coil, an electric current in response to a digital control signal received from the central control circuit 101.

When write operation of user data is performed, the format generation circuit 137 generates a format of a data sector including a sub preamble and a SYNC pattern with a write position of each data sector being determined on a data track basis, and then provides the central control circuit 101 with the format. The central control circuit 101 embeds user data and ECC in the recording format before transmitting the format to the write channel. Next, a pattern of the sub preamble will be described with reference to FIG. 4.

Format Structure According to a First Embodiment

Figure 4:
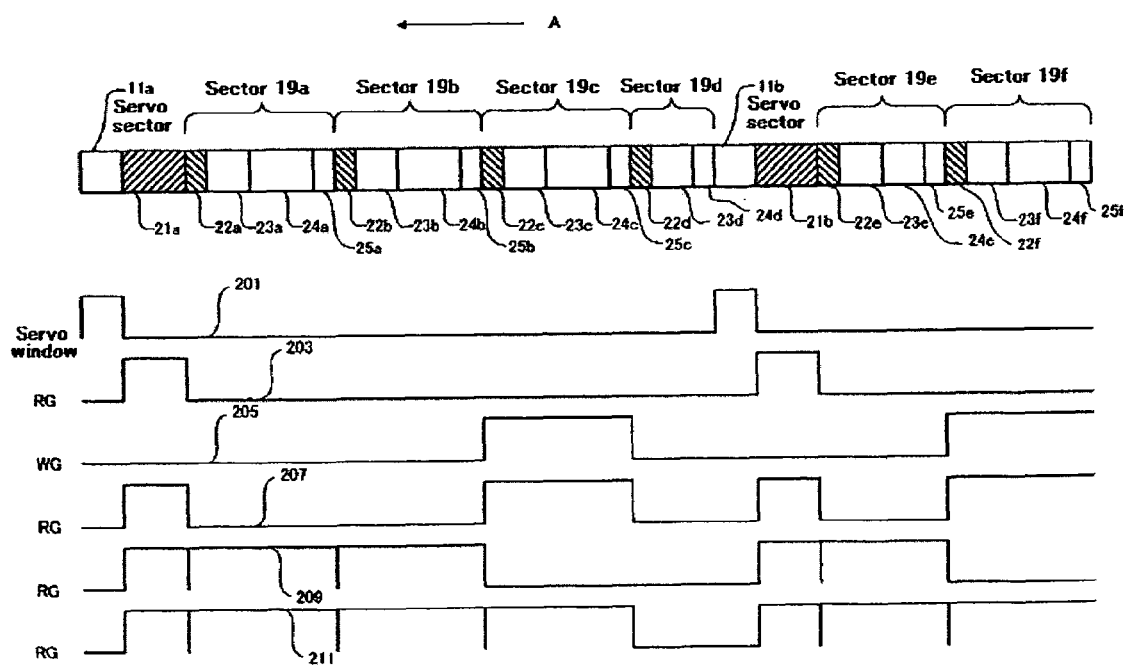
FIG. 4 is a diagram illustrating an example of a format structure of a data area.

FIG. 4 is a diagram illustrating a format structure of a typical data track of the magnetic disk 10. Here, it is assumed that the data track moves in a direction indicated with an arrow A by the rotation of the magnetic disk 10. On the data track, data sectors 19a through 19d are located in a data area provided between servo sectors 11a and 11b; and data sectors 19e, 19f are located in a data area subsequent to the servo sector 11b. Each of the data sectors 19d, 19e is formed as a split sector. Moreover, main preambles 21a and 21b are written to associated data areas one by one at respective positions adjacent to preceding servo sectors 11a and 11b, respectively. In this specification, "preceding" means that a rotating servo sector or a rotating data sector is located at a position at which reading by the magnetic head is performed earlier. In each of the zones 14 through 17 of the magnetic disk 10, data sectors are located in such a format that if the zone is the same, the number of data sectors formed between servo sectors is the same and a structure of a split sector is also the same.

The data sectors 19a through 19f are constituted of sub preambles 22a through 22f, SYNC patterns 23a through 23f, data blocks 24a through 24f, and ECCs 25a through 25f, respectively. However, because the split sector 19d constitutes one data sector with the split sector 19e being combined with the split sector 19d, it has no ECC. The main preambles 21a, 21b and sub preambles 22a through 22e are formed in a repeated pattern whose period is constant. The timing adjustment circuit 129 is used to synchronize a data clock with these read signals. The main preambles 21a, 21b are written at a frequency of the data clock that is set beforehand in each of the zones 14 through 17. After that, rewriting is not performed during writing by the magnetic disk drive 100. After servo data is written before shipment, the main preambles are written.

On the other hand, each of the sub preambles 22a through 22f is rewritten as part of each data sector in the timing in which each data sector in question is written. The bit length of the main preambles according to this embodiment is almost the same as that of a preamble constituting a data sector of the conventional magnetic disk drive that is capable of making access on a data sector basis. This bit length is sufficient for synchronizing a data clock with a read clock of the main preamble by the timing adjustment circuit 129. The bit length of the sub preambles according to this embodiment is set at 25% of the bit length of the main preambles. If such a configuration is used, the area occupied by the preamble in the conventional data sector can be reduced to about a half.

The main preambles 21a, 21b and the sub preambles 22a through 22f work in cooperation with one another at the time of synchronous operation of the timing adjustment circuit 129. If the bit length of the sub preambles is properly set, it is not always necessary to set the bit length of the main preambles at a value that is sufficient for independently synchronizing a data clock. With the objective of keeping the write efficiency and synchronization performance of the preambles in balance, it is desirable to set the bit length of the sub preambles at about from 10% to 40% of the bit length of the main preambles. The bit length of a sub preamble of each data sector is the same. As a result, the total bit length of each data sector is also the same. If the bit length of each data sector is configured to be the same, a recording format circuit 137 for generating a recording format becomes simplified conveniently.

With the objective of finding out the top of a data sector, SYNC patterns 23a through 23f are formed in a particular pattern that is not included in the RLL protocol. The central control circuit 101 identifies, as user data, a read signal obtained after detecting a SYNC pattern, and then transmits the read signal to the host equipment. The data blocks 24a through 24f are write areas, each having the length of 512 bytes, adapted to write user data thereto. Data modulated with a channel code of RLL is written to each data block. When data read out from a data block in the read channel is reproduced, the data is divided on a channel code basis before decoding the data, and thereby original user data is reproduced. The SYNC patterns 23a through 23f are used to detect a delimiter of the channel code in question.

Each gap area is formed between data sectors that are adjacent to each other. The gap area is used to eliminate the rotation jitter, and thereby to prevent an adjacent data sector from being overwritten. The sub preamble 22a through 22f, the SYNC patterns 23a through 23f, and gap areas are provided to enable the magnetic disk drive 100 to function as a direct access storage device capable of rewriting on a data sector basis. ECCs 25a through 25f are error correction codes that are written concurrently with user data. The central control circuit 101 uses the ECCs 25a through 25f to detect and correct a bit error at the time of reading.

Read and Write Operation

Next, operation performed when the magnetic disk drive 100 writes data sectors will be described. The central control circuit 101 generates an SG pulse in the timing in which the servo sectors 11a, 11b arrive at the read head, and then transmits the SG pulse to the servo control circuit 135. As shown in FIG. 4, upon receiving the SG pulse, the servo control circuit 135 asserts the SG pulse in the timing of the servo sectors 11a, 11b to generate a servo detection window 201 to be negated at an end position of a servo sector so that servo data is read. Then, the servo control circuit 135 transmits, to the central control circuit 101, a cylinder address, a servo sector address, and a read signal of a burst pattern. Upon receiving these signals, the central control circuit 101 transmits to the driver circuit 139 a control signal for locating the magnetic head 113 at a position instructed by the host equipment.

Now, it is assumed that the magnetic disk drive 100 interprets a write command received from the host equipment, and writes user data at positions of the data sectors 19c, 19f. The central control circuit 101 writes the user data received from the host equipment and ECC calculated by itself to a recording format of the data sectors 19c, 19f that has been generated by the format generation circuit 137. The central control circuit 101 then transmits the user data and the ECC to the modulation circuit 103 of the write channel. The format includes a bit pattern forming the sub preambles 22c, 22f, and information about a write position of a data sector. The central control circuit 101 instructs the frequency synthesizer 131 of a frequency of a data clock that is specified for a zone to which the data sectors 19c, 19f belong.

When the central control circuit 101 generates an RG pulse 203 to be asserted within a range in which the main preamble 21a is read, and then operates the read channel, the read channel handles a signal obtained by reading the main preamble 21a while the RG pulse 203 is asserted. The frequency synthesizer 131 supplies, to the timing adjustment circuit 129, a data clock having a frequency corresponding to the data sector 19c to be written. The timing adjustment circuit 129 transmits a data clock, which is synchronized with the signal obtained by reading the main preamble 21a, to the read/write channel and the central control circuit 101. The timing adjustment circuit 129 supplies, to the write compensation circuit 109, a write clock that is synchronized with the read signal of the main preamble 21a.

When the servo detection window 201 is negated, the read channel stops reading of the main preamble 21a, and the timing adjustment circuit 129 continues the supply of the write clock to the write compensation circuit 109 with a frequency of the write clock which is being output at this point in time being fixed. In this embodiment, the main preamble 21a has the bit length that is sufficient for synchronizing the output of the timing adjustment circuit 129. Accordingly, the write clock is in synchronization with the read signal of the main preamble 21a at this point in time. When the data sector 19c arrives at a position of the write head as a result of the rotation of the magnetic disk, the central control circuit 101 asserts the WG pulse 205. In the timing of the write clock that is synchronized with the read signal of the main preamble 21a, the write compensation circuit 109 writes the sub preamble 22c, the SYNC pattern 23c, the data block 24c, and the ECC 25c that constitute the data sector 19c. The main preamble 21b and the data sector 19f are also handled under the same control, and consequently the data sector 19f is written.

Here, because the write clock is in synchronization with the read signal of the main preamble 21a, as compared with a case where a data sector is written with a clock having the conventional fixed frequency, the features described below are formed. Now, it is assumed that the rotational speed at the time of writing the data sector 19b with a data clock having a fixed frequency f is V1, and that the rotational speed at the time of writing the data sector 19c with the data clock having the fixed frequency f is V2. The linear recording density n1 of the data sector 19b becomes f/V1 and the linear recording density n2 of the data sector 19c becomes f/V2. Accordingly, the linear recording density of the data sectors 19b, 19c depends on the rotational speed V1, V2 of the magnetic disk when each of the data sectors 19b, 19c is written. Here, the linear recording density is the number of bits per unit length written in the circumferential direction of the magnetic disk.

On the other hand, as described in this embodiment, when the data sectors 19b, 19c are written with a write clock that is synchronized with the read signal of the main preamble 21a, the operation becomes as follows. On the assumptions that the linear recording density of the main preamble 21a is n, and that the rotational speed of the magnetic disk at the time of writing the data sectors 19b and 19c are V1 and V2, respectively, frequencies f1 and f2 of the write clock at the time of writing the data sectors 19b and 19c become nV1 and nV2, respectively. The linear recording densities n1 and n2 of the data sectors 19b and 19c become f1/V1 and f2/V2, respectively. As a result, both of them become n, that is, become equivalent to each other.

However, strictly speaking, the linear recording densities of the data sectors 19b, 19c do not coincide with each other due to the influence of the slight rotation jitter that occurs from the time at which the main preamble 21a is read until the time at which the data sector 19b or 19c is written. However, as compared with writing with a data clock having a fixed frequency, the linear recording density of them becomes much closer to each other. Therefore, the data sector 19c is written at a position at which a phase of a read signal of the data sector 19c is synchronized with a phase of a read signal of the main preamble 21a. Accordingly, frequencies of the read signals also coincide with each other. Incidentally, in FIG. 4, the main preamble 21a relating to reading and the data sectors 19c, 19f relating to writing are illustrated as if they were located on the same data track. However, in the case of a head structure in which the write head and the read head are separated, that is to say, if a read/write offset or a dual head offset exists, the main preamble 21a and the data sectors 19c, 19f actually exist on different data tracks. Because the rotational speed of the magnetic disk differs depending on a position of a data track, a deviation in linear recording density becomes larger to some extent.

Next, operation at the time of reading the data sector 19c will be described. The central control circuit 101 performs servo control operation in a manner similar to that at the time of writing. When the central control circuit 101 generates an RG pulse 207 to be asserted within a range in which the main preamble 21a is read, and operates the read channel, the read channel handles a signal obtained by reading the main preamble 21a. The frequency synthesizer 131 supplies, to the timing adjustment circuit 129, a data clock corresponding to the data sector 19c to be read. The timing adjustment circuit 129 supplies, to the A/D converter 119, a read clock that is synchronized with the read signal of the main preamble 21a.

The central control circuit 101 negates the RG pulse 207 at positions of the data sectors 19a, 19b, and then asserts the RG pulse 207 at a position of the data sector 19c again. While the RG pulse 207 is kept negated, the timing adjustment circuit 129 continuously supplies the read clock to the A/D converter 119 with a frequency of the read clock which is synchronized with the read signal of the main preamble 21a being fixed. The read channel first reads the sub preamble 22c that is written at the top of the data sector 19c. A frequency of the read clock which is output from the timing adjustment circuit 129 is fixed at a point in time at which the read clock is synchronized with the read signal of the main preamble 2a.

Therefore, the timing adjustment circuit 129 starts the synchronous operation from this frequency.

The sub preamble 22c is written with the linear recording density that is the same as that of the main preamble 21a, and at a position at which a phase is synchronized with the main preamble 21a. Accordingly, the sub preamble 22c does not have the bit length that is long enough to be independently synchronized. However, even if the rotation jitter and the clock jitter occur from the read time of the main preamble 21a until the read time of the data sector 19c, the timing adjustment circuit 129 can eliminate them so that the read signal of the sub preamble 22c is synchronized with the read clock.

The timing adjustment circuit 129 supplies, to the A/D converter 119, a read clock that is synchronized with a read signal of the sub preamble 21c. As a result, the A/D converter 119 can sample an inputted analog signal at a proper position to digitize the analog signal. The data sector 19f can also be read by use of the main preamble 21b in like manner. In this embodiment, even if each data sector does not include a preamble whose bit length is long enough to achieve complete synchronization as before, cooperative operation of a main preamble and a sub preamble makes it possible to synchronize a read clock with a data sector to be read so as to prevent read operation from being hindered. Therefore, it is possible to extend a write area of user data.

Next, another method for writing the data sectors 19c, 19f will be described. The central control circuit 101a asserts an RG pulse 209 to write a data sector. The RG pulse 209 is in an asserted state for a period of time during which the data sector 19b is read starting from the main preamble 21a. However, the RG pulse 209 is negated for a very short period of time at a boundary between the main preamble 21a and the data sector 19a, and at a boundary between the data sectors 19a and 19b. Then, the central control circuit 101 negates the RG pulse 209, and asserts the WG pulse 205 to write the data sector 19c. In this case, the read channel performs read operation from the main preamble 21a up to the data sector 19b; and at a point in time at which the RG pulse 209 is negated, the timing adjustment circuit 129 synchronizes the read clock with a read signal of the data sector 19b. The synchronized read clock becomes a write clock that is supplied to the write compensation circuit 109 at the time of writing.

The main preamble 21a and the data sectors 19a, 19b are written with the same linear recording density. The timing adjustment circuit 129 uses not only the read signal of the main preamble 21a but also read signals of the preceding data sectors 19a, 19b to generate a write clock so that a synchronized state is continued. Therefore, as compared with a case where the RG pulses 203, 205 are used for writing, the influence of the clock jitter is further eliminated, and the instability of electronic circuits is further avoided. As a result, it is possible to make the linear recording density of the data sector 19c much closer to that of the main preamble 21a. The data sector 19f can also be written using the same steps.

Next, another method for reading the data sectors 19c, 19f will be described. The central control circuit 101 asserts an RG pulse 211 to read the data sectors 19c, 19f. In order to read the data sector 19c, the RG pulse 211 is asserted from a position of the main preamble 21a up to a position of the data sector 19c. However, as is the case with the RG pulse 209, the RG pulse 211 is negated for a very short period of time at a boundary of each data sector. Therefore, the read channel reads user data of the data sectors 19a through 19c, and then transmits the user data to the central control circuit 101. At this time, the central control circuit 101 discards the user data of the data sectors 19a, 19b.

The data sectors 19a, 19b are written with the same linear recording density as that of the main preamble 21a and that of the data sector 19c. At the same time, the data sectors 19a, 19b are written at positions that are synchronized with the main preamble 21a. Therefore, even if the rotation jitter and the clock jitter occur from the time at which the main preamble 21a is read until the time at which the data sector 19c is read, it is possible to synchronize the read clock with a read signal of the immediately preceding data sector 19b. Accordingly, as compared with a case where a read is made by the RG pulse 207, the timing adjustment circuit 129 can perform synchronous operation more precisely. The data sector 19e can also be read in like manner.

In this embodiment, although the sub preambles 22a through 22f are configured to have the same bit length, it can also be so configured that the bit length of each sub preamble becomes longer with the increase in distance between the sub preamble in question and its preceding main preamble. The reason is as follows. Because the rotation jitter and the clock jitter exert a larger influence on data sectors with the increase in distance between a data sector and its preceding preamble, a ratio of sub preamble's contribution to the synchronization increases. In this case, although the bit lengths of data sectors relating to one main preamble differ from one another, the format generation circuit 137 generates such a format.

Write and Read Operation for Format According to Second Embodiment

Figure 5:
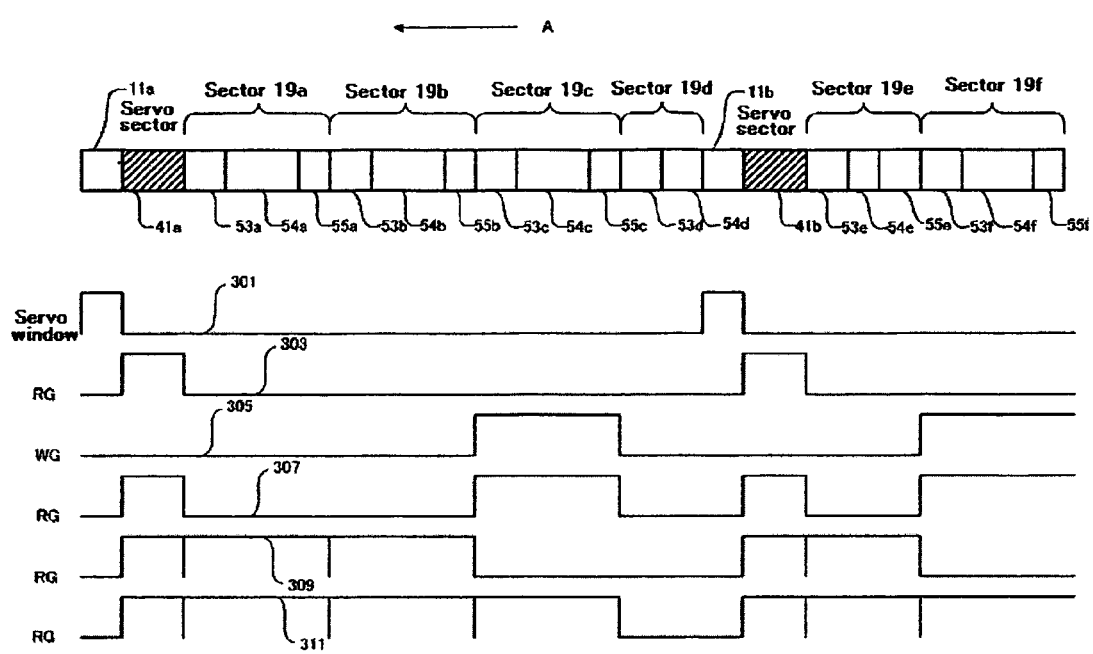
FIG. 5 is a diagram illustrating another example of a format structure of a data area.

FIG. 5 is a diagram illustrating another format structure of a data track in the magnetic disk 10. In the format structure shown in FIG. 5, the data sectors 19a through 19d are formed between the servo sectors 11a, 11b, and the data sectors 19e and 19f are subsequent to the servo sector 11b. The data sectors 19a through 19f are constituted of SYNC patterns 53a through 53f, data blocks 54a through 54f, and ECC 55a through 55f, respectively. A preamble is eliminated from each of the data sectors. In addition, common preambles 41a, 41b are located at positions adjacent to preceding servo sectors 11a, 11b respectively. In this embodiment, although each data area is provided with one common preamble, each data area may also be provided with two or more common preambles.

The common preambles 41a, 41b are formed in a repeated pattern similar to the main preamble and the sub preamble shown in FIG. 4. The timing adjustment circuit 129 uses the common preambles 41a, 41b to synchronize a data clock. The common preambles are written at a frequency of the data clock that is set beforehand in each of the zones 14 through 17. It is so devised that the common preambles are not rewritten at the time of writing user data thereafter. The common preambles 41a, 41b have the length that is sufficient for the synchronization required to read subsequent data by the read/write channel. The meanings of the SYNC patterns 53a through 53f, the data blocks 54a through 54f, and the ECC 55a through 55f are the same as those described in FIG. 4.

Operation performed when the magnetic disk drive 100 writes the data sectors 19c, 19f is substantially the same as that described in the figure. For the servo detection window 301, the RG pulses 303, 307, 309, 311, and the WG pulse 305 shown in FIG. 5, write and read operation of them are performed by the read/write channel in correspondence with the servo detection window 201, the RG pulses 203, 207, 209, 211, and the WG pulse 205 shown in FIG. 4 respectively. A point of difference from the case shown in FIG. 4 is that because each data sector does not include a sub preamble, the timing adjustment circuit 129 synchronizes the data clock only with a read signal of the common preambles 41a, 41b.

Therefore, if the rotation jitter of the magnetic disk is large it becomes more difficult to perform read operation in comparison with the case shown in FIG. 4. The rotation jitter occurs during a period of time from reading of the common preambles 41a, 41b until reading of a data sector to be read. Thus, it is desirable that the tolerance of the rotation jitter of the magnetic disk be specified at about 0.01% or less. However, if a write clock or a read clock is synchronized using a read signal of a preceding data sector (for example, the data sectors 19c, 19f are written by use of the RG pulse 309 and the WG pulse 305, and the data sectors 19c, 19f are read by use of the RG pulse 311), the influence of the clock jitter and the rotation jitter is reduced, which makes it possible to perform more precise synchronous operation.

Up to this point, the present invention has been described on the basis of the specific embodiments shown in the diagrams. The present invention, however, is not limited to the embodiments illustrated in the diagrams. It is needless to say that so long as the effects of the present invention are produced, any configuration which is known in the past can also be adopted.

It is to be understood that the above description is intended to be illustrative and not restrictive. Many embodiments will be apparent to those of skill in the art upon reviewing the above description. The scope of the invention should, therefore, be determined not with reference to the above description, but instead should be determined with reference to the appended claims along with their full scope of equivalents.

What is claimed is:

1. A magnetic disk drive that adopts a data-surface servo system, said magnetic disk drive comprising:
   a magnetic disk including a main preamble that is written at a frequency of a data clock;
   a write channel for writing a plurality of data sectors each including a sub preamble and user data, with a write clock that is synchronized with a signal obtained by reading the main preamble; and
   a read channel for, when any of the plurality of written data sectors is read, generating a read clock by use of the signal obtained by reading the main preamble and a signal obtained by reading the sub preamble included in a data sector to be read,
   wherein:
   a bit length of the sub preamble becomes longer with the increase in distance between the data sector and the main preamble.

2. The magnetic disk drive according to claim 1, wherein: only one said main preamble is located in each data area.

3. The magnetic disk drive according to claim 2, wherein: said main preamble is located at a position adjacent to a preceding servo sector thereof.

4. The magnetic disk drive according to claim 1, wherein: said magnetic disk drive adopts a zone-bit recording method, and the main preamble is written at a frequency of a data clock set in each zone of a plurality of zones arranged radially on the magnetic disk.

5. The magnetic disk drive according to claim 1, wherein: said servo sector is written from the innermost radius side towards the outermost radius side of the magnetic disk at the same frequency, and a write frequency of the servo sector differs from a write frequency of the data clock.

6. A magnetic disk drive that adopts a data-surface servo system, said magnetic disk drive comprising:
   a magnetic disk including a main preamble that is written at a frequency of a data clock;
   a write channel for writing a plurality of data sectors each including a sub preamble and user data, with a write clock that is synchronized with a signal obtained by reading the main preamble; and
   a read channel for, when any of the plurality of written data sectors is read, generating a read clock by use of the signal obtained by reading the main preamble and a signal obtained by reading the sub preamble included in a data sector to be read,
   wherein:
   at the time of writing the data sector, said write channel generates the write clock by use of the signal obtained by reading the main preamble and a signal obtaining by reading the preceding data sector of a data sector to be written.

7. The magnetic disk drive according to claim 6, wherein: a bit length of said each sub preamble included in each of the plurality of written data sectors is the same as the bit length of the sub preambles included in the other written data sectors.

8. The magnetic disk drive according to claim 7, wherein: the bit length of the main preamble is sufficient for independently reading the user data, and is longer than the bit length of the sub preamble.

9. The magnetic disk drive according to claim 7, wherein: a ratio of the bit length of the sub preamble to the bit length of the main preamble ranges from about 10% to 40%.

10. A magnetic disk drive that adopts a data-surface servo system, said magnetic disk drive comprising:
    a magnetic disk including a main preamble that is written at a frequency of a data clock;
    a write channel for writing a plurality of data sectors each including a sub preamble and user data, with a write clock that is synchronized with a signal obtained by reading the main preamble; and
    a read channel for, when any of the plurality of written data sectors is read, generating a read clock by use of the signal obtained by reading the main preamble and a signal obtained by reading the sub preamble included in a data sector to be read,
    wherein:
    at the time of reading the written data sector, said read channel generates the read clock by use of the signal obtained by reading the main preamble, a signal obtained by reading the preceding data sector of a data sector to be read, and a signal obtained by reading the sub preamble included in the data sector to be read.

11. A method for writing and reading user data in a magnetic disk drive that adopts a data-surface servo system, said method comprising:
    providing a magnetic disk in which at a frequency of a data clock, a main preamble is written to each data area formed between servo sectors, after servo data are written and before shipment of the magnetic disk drive;
    writing a plurality of data sectors each including the sub preamble and user data, to said each data area with a write clock that is synchronized with a read signal of the main preamble;
    performing synchronous operation of a read channel while reading the main preamble; and
    performing, subsequent to performing the synchronous operation, synchronous operation of the read channel while reading the sub preamble of a data sector selected from among the plurality of written data sectors.

12. A writing and reading method according to claim 11, wherein:
    providing the magnetic disk includes writing the main preamble to the magnetic disk before the magnetic disk drive is shipped.

13. A writing and reading method according to claim 11, wherein:
provproviding the magnetic disk includes writing the main preamble at a position adjacent to each preceding servo sector in all data areas formed between the servo sectors.

14. A method for writing and reading user data in a magnetic disk drive that adopts a data-surface servo system, said method comprising:
providing a magnetic disk in which at a frequency of a data clock, a main preamble is written to each data area formed between servo sectors;
writing a plurality of data sectors each including the sub preamble and user data, to said each data area with a write clock that is synchronized with a read signal of the main preamble;
performing synchronous operation of a read channel while reading the main preamble; and
performing, subsequent to performing the synchronous operation, synchronous operation of the read channel while reading the sub preamble of a data sector selected from among the plurality of written data sectors,
wherein:
writing the data sectors includes generating the write clock by use of a signal obtained by reading the main preamble and a signal obtained by reading the preceding data sector of the data sector to be written.

15. A method for writing and reading user data in a magnetic disk drive that adopts a data-surface servo system, said method comprising:
providing a magnetic disk in which at a frequency of a data clock, a main preamble is written to each data area formed between servo sectors;
writing a plurality of data sectors each including the sub preamble and user data, to said each data area with a write clock that is synchronized with a read signal of the main preamble;
performing synchronous operation of a read channel while reading the main preamble; and
performing, subsequent to performing the synchronous operation, synchronous operation of the read channel while reading the sub preamble of a data sector selected from among the plurality of written data sectors,
wherein:
reading the data sector includes generating the read clock by use of the signal obtained by reading the main preamble, a signal obtained by reading the preceding data sector of the data sector to be read, and a signal obtained by reading the sub preamble included in the data sector to be read.

16. A magnetic disk drive that adopts a data-surface servo system, said magnetic disk drive comprising:
a magnetic disk including a common preamble that is written at a frequency of a data clock;
a write channel for writing a plurality of data sectors with a write clock that is synchronized with a signal obtained by reading the common preamble; and
a read channel for, when any of the plurality of written data sectors is read, synchronizing a read clock with a signal obtained by reading the common preamble,
wherein:
said common preamble is written at a position adjacent to the preceding servo sector thereof; and
at the time of writing the data sector, said write channel generates the write clock by use of a read signal of the common preamble, and a read signal of the preceding data sector of the data sector to be written.

17. A magnetic disk drive that adopts a data-surface servo system, said magnetic disk drive comprising:
a magnetic disk including a common preamble that is written at a frequency of a data clock;
a write channel for writing a plurality of data sectors with a write clock that is synchronized with a signal obtained by reading the common preamble; and
a read channel for, when any of the plurality of written data sectors is read, synchronizing a read clock with a signal obtained by reading the common preamble,
wherein:
said common preamble is written at a position adjacent to the preceding servo sector thereof; and
at the time of reading the written data sector, said read channel generates the read clock by use of the common preamble, and a read signal of the preceding data sector of the data sector to be read.

18. The magnetic disk drive according to claim 16, wherein:
the top of data in each one of said data sectors is a SYNC pattern.

19. The magnetic disk drive according to claim 17, wherein:
the top of data in each one of said data sectors is a SYNC pattern.

* * * * *